(12) United States Patent
Chen et al.

(10) Patent No.: US 7,953,257 B2
(45) Date of Patent: May 31, 2011

(54) SLIDING TYPE THIN FINGERPRINT SENSOR PACKAGE

(75) Inventors: Yeh-Shun Chen, Kaohsiung (TW);
Yung-Jen Chen, Kaohsiung (TW);
Lin-Hsin Chen, Kaohsiung (TW);
Hua-Ping Chen, Kaohsiung (TW);
Heng-Ting Liu, Kaohsiung (TW)

(73) Assignee: Chipbond Technology Corporation, Hsinchu (TW)

( * ) Notice: Subject to any disclaimer, the term of this patent is extended or adjusted under 35 U.S.C. 154(b) by 813 days.

(21) Appl. No.: 11/976,306

(22) Filed: Oct. 23, 2007

(65) Prior Publication Data
US 2009/0103787 A1 Apr. 23, 2009

(51) Int. Cl.
*G06K 9/00* (2006.01)
*H05F 3/00* (2006.01)
(52) U.S. Cl. ........................ 382/124; 361/220
(58) Field of Classification Search .................. None
See application file for complete search history.

(56) References Cited

U.S. PATENT DOCUMENTS

| | | | | |
|---|---|---|---|---|
| 5,920,640 A * | 7/1999 | Salatino et al. | ............... | 382/124 |
| 6,246,566 B1 * | 6/2001 | Glenn | ............... | 361/220 |
| 6,628,812 B1 * | 9/2003 | Setlak et al. | ............... | 382/124 |
| 6,737,329 B2 * | 5/2004 | Lepert et al. | ............... | 438/393 |
| 7,545,621 B2 * | 6/2009 | Haddad | ............... | 361/220 |
| 7,630,183 B2 * | 12/2009 | Shin | ............... | 361/56 |
| 2003/0068072 A1 * | 4/2003 | Hamid | ............... | 382/124 |
| 2006/0083411 A1 * | 4/2006 | Benkley, III | ............... | 382/124 |
| 2007/0122013 A1 * | 5/2007 | Setlak et al. | ............... | 382/124 |
| 2008/0075339 A1 * | 3/2008 | Haddad | ............... | 382/124 |
| 2008/0085038 A1 * | 4/2008 | Huang et al. | ............... | 382/124 |
| 2008/0187191 A1 * | 8/2008 | Huang et al. | ............... | 382/124 |
| 2009/0073632 A1 * | 3/2009 | Yang et al. | ............... | 361/220 |

\* cited by examiner

*Primary Examiner* — Bhavesh M Mehta
*Assistant Examiner* — Barry Drennan
(74) *Attorney, Agent, or Firm* — Muncy, Geissler, Olds & Lowe, PLLC

(57) ABSTRACT

A sliding type thin fingerprint sensor package defined as a sliding region and a conductive portion comprises a substrate, a fingerprint sensor chip and a metal plate. The fingerprint sensor chip is electrically connected with the substrate and a sensing region of the fingerprint sensor chip is exposed by a window of the dielectric layer. The metal plate is electrically connected with the substrate and a sliding surface of the metal plate is close to the sensing region of the fingerprint sensor chip. The sensing region and the sliding surface are exposed by the window of the dielectric layer. The sensing region of the fingerprint sensor chip and the sliding surface of the metal plate are located at the sliding region, and a plurality of external contact pads on a circuit layer of the substrate are located at the conductive portion.

18 Claims, 9 Drawing Sheets

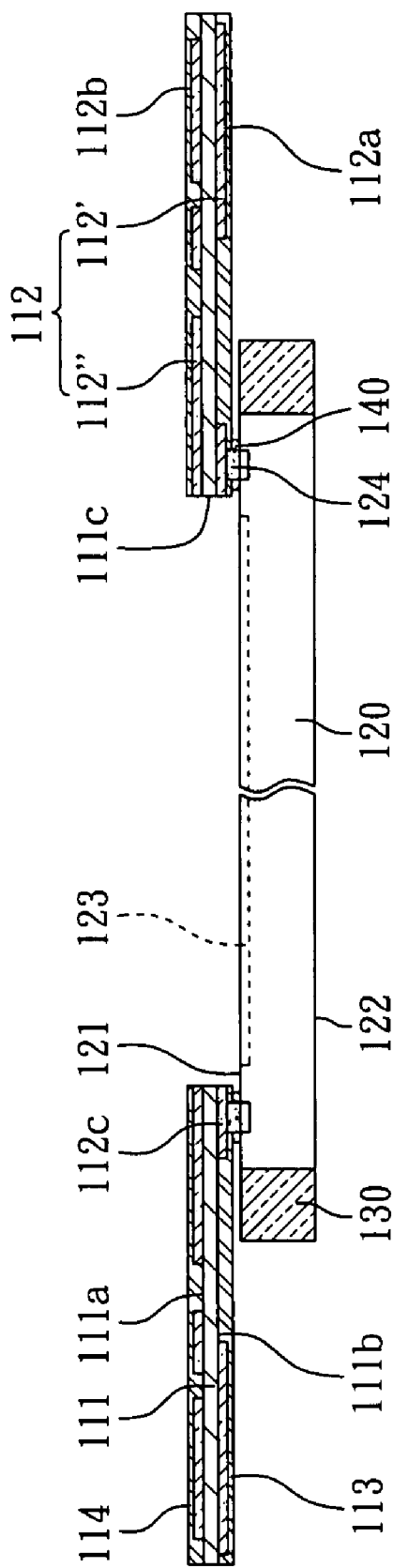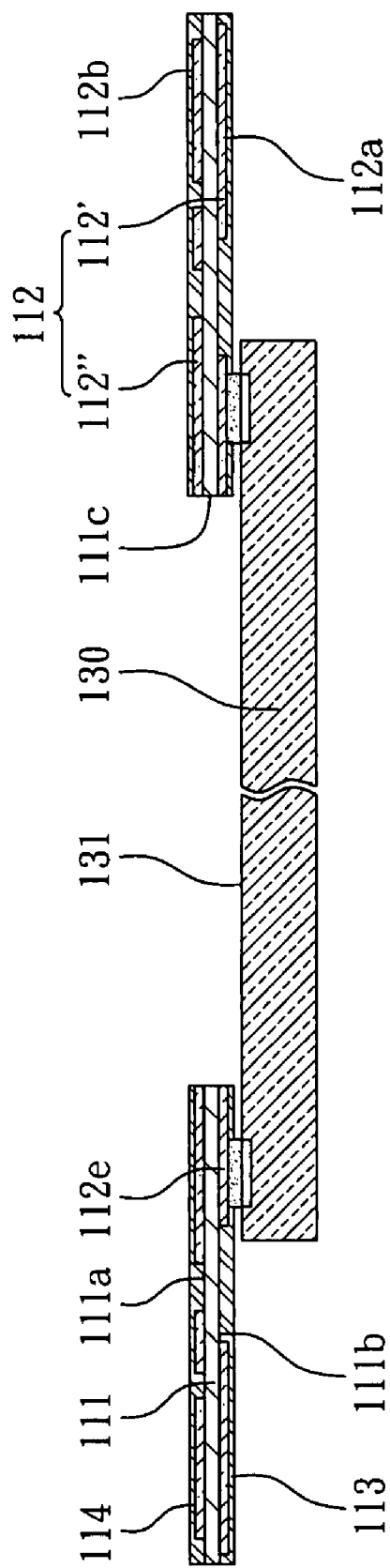

SLIDING TYPE THIN FINGERPRINT SENSOR PACKAGE

FIELD OF THE INVENTION

The present invention is generally relating to a fingerprint sensor package, more particularly, to a sliding type thin fingerprint sensor package.

BACKGROUND OF THE INVENTION

FIG. 14 shows a well-known fingerprint sensor package 10, which mainly comprises a substrate 11, a semiconductor chip 12 and an encapsulant 13. The substrate 11 has an upper surface 11*a* and a lower surface 11*b* and the semiconductor chip 12 having a fingerprint sensing surface 12*a* is disposed on the upper surface 11*a* of the substrate 11 and electrically connected with the substrate 11. The encapsulant 13 is formed on the upper surface 11*a* of the substrate 11 to encapsulate a portion of the semiconductor chip 12 and expose the fingerprint sensing surface 12*a* of the semiconductor chip 12. However, there is no electrostatic discharge device disposed in the known fingerprint sensor package 10, it is easy to cause short circuit problem on the fingerprint sensor package 10 because an electrostatic cannot be discharged via the electrostatic discharge device in this case when finger touches the fingerprint sensing surface 12*a* of the semiconductor chip 12.

SUMMARY OF THE INVENTION

The primary object of the present invention is to provide a sliding type thin fingerprint sensor package defined as a sliding region and a conductive portion, which comprises a substrate, a fingerprint sensor chip and a metal plate. The substrate comprises a dielectric layer having an upper surface, a lower surface and a window penetrating the upper surface and the lower surface, a circuit layer having a first surface, a second surface, a plurality of internal contact pads and a plurality of external contact pads, and a first passivation layer having a plurality of first openings, in which the internal contact pads are formed on the lower surface of the dielectric layer, the first passivation layer is formed on the first surface of the circuit layer, and the first openings expose the internal contact pads. The fingerprint sensor chip is electrically connected with the internal contact pads of the substrate and has an active surface, a back surface and a sensing region exposed by the window of the dielectric layer. The metal plate is electrically connected with the substrate and has a sliding surface close to the sensing region of the fingerprint sensor chip exposed by the window of the dielectric layer. Wherein the sensing region of the fingerprint sensor chip and the sliding surface of the metal plate are located at the sliding region, the external contact pads of the circuit layer are located at the conductive portion. In this invention, due to the structure that the window of the dielectric layer exposes the sensing region of the fingerprint sensor chip and the sliding surface of the metal plate and both of which are located at the sliding region, an electrostatic may substantially be discharged via the sliding surface of the metal plate when finger touches the sliding region, thereby obtaining improvements on lowering manufacturing cost and thickness of the sliding type thin fingerprint sensor package.

DESCRIPTION OF THE DRAWINGS

FIG. 3 is a cross-sectional view of the sliding type thin fingerprint sensor package taken along A-A direction in FIG. 2 in accordance with a first embodiment of the present invention.

FIG. 4 is a cross-sectional view of the sliding type thin fingerprint sensor package taken along B-B direction in FIG. 2 in accordance with a first embodiment of the present invention.

DETAILED DESCRIPTION OF THE INVENTION

Figure 1:
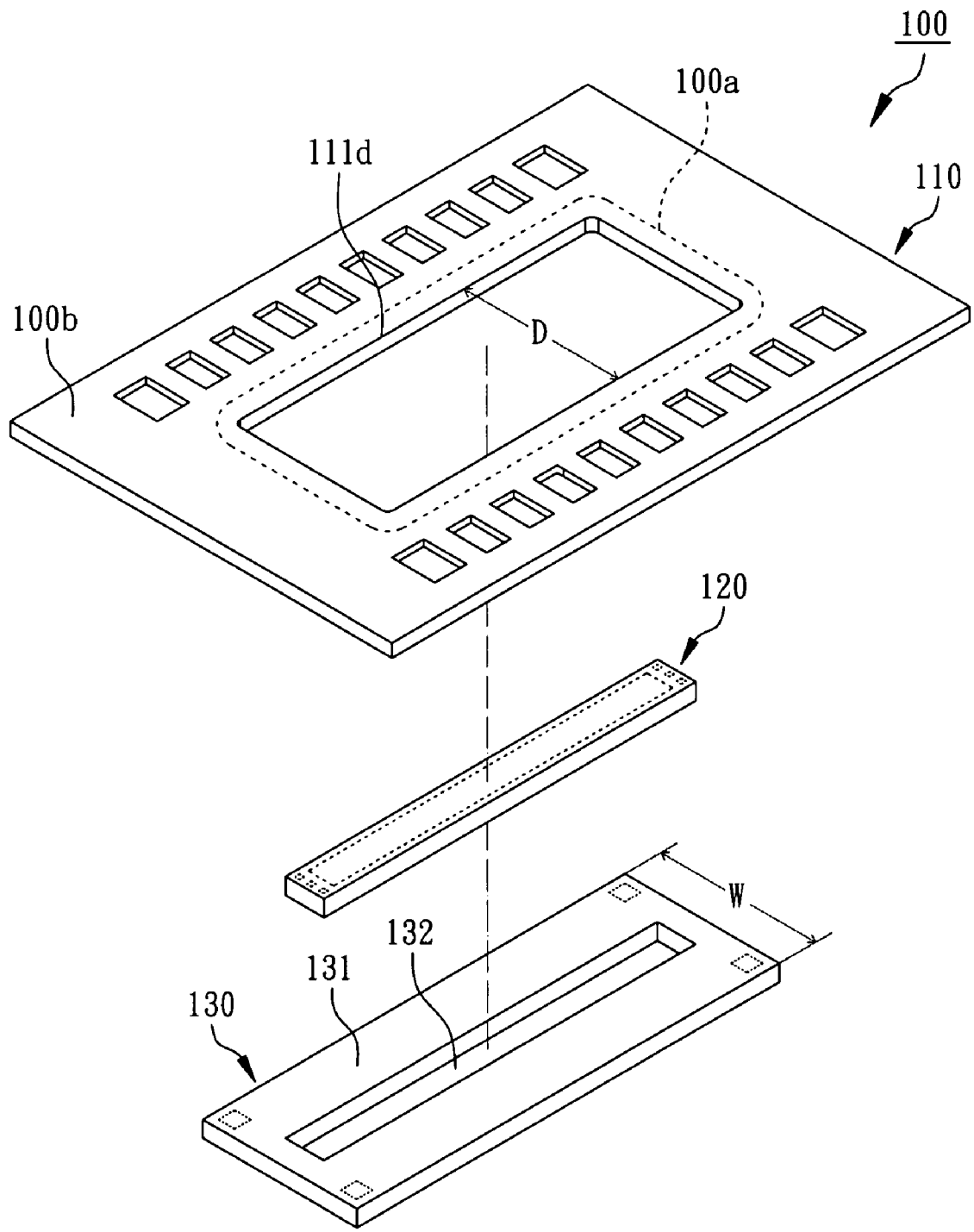
FIG. 1 is a perspective explored view of a sliding type thin fingerprint sensor package in accordance with a first embodiment of the present invention.
Figure 2:
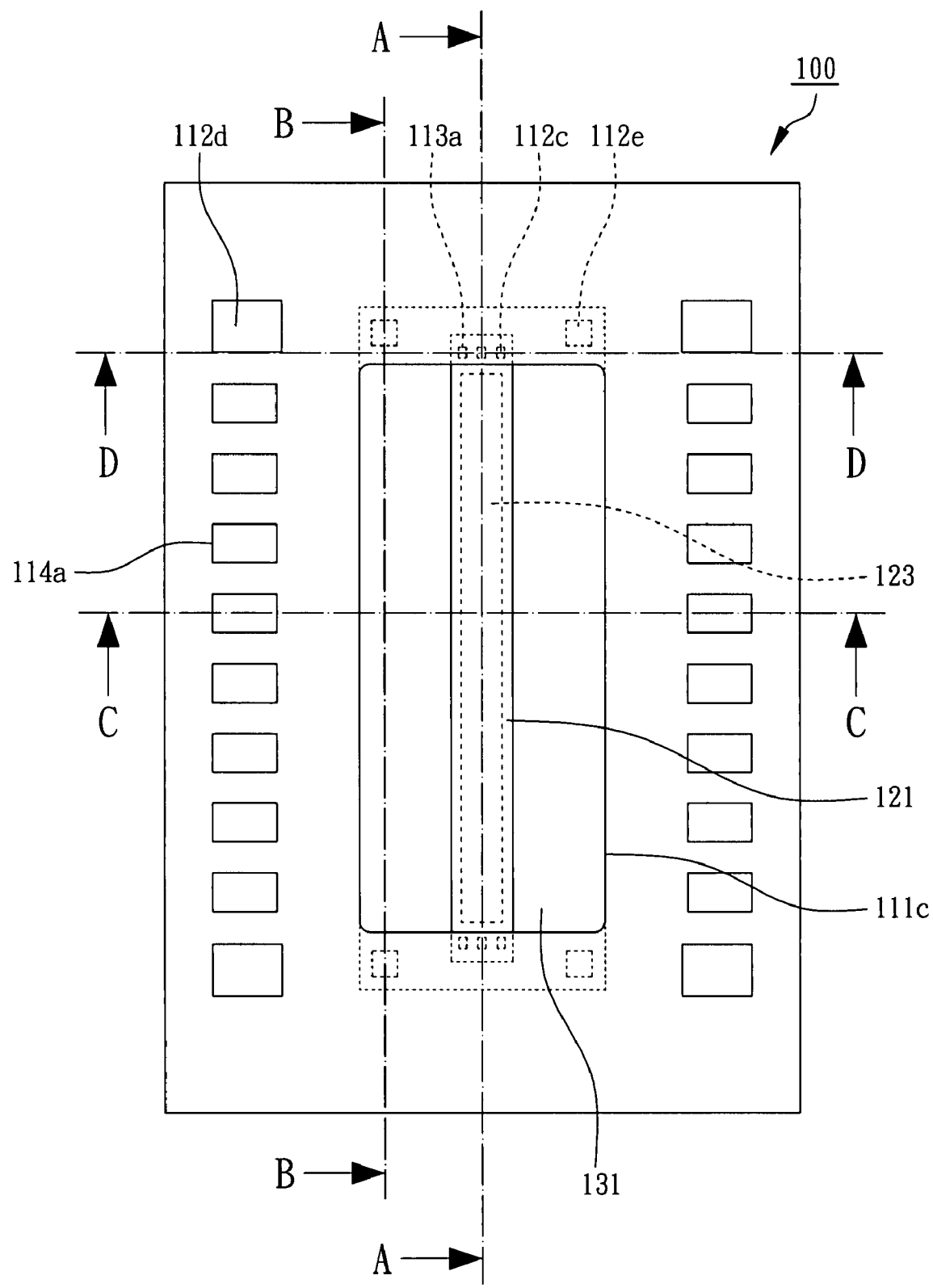
FIG. 2 is a top view of the sliding type thin fingerprint sensor package in accordance with a first embodiment of the present invention.

Referring to FIGS. 1, 2 and 3, a sliding type thin fingerprint sensor package 100 according to a first embodiment of the present invention is disclosed, which is defined as a sliding region 100*a* and a conductive portion 100*b* and mainly comprises a substrate 110 such as printed circuit board or soft circuit board, a fingerprint sensor chip 120 and a metal plate 130. Either printed circuit board or soft circuit board may generally be adopted for the substrate 110, however in this embodiment, a flexible substrate is used. The substrate 110 comprises a dielectric layer 111 having an upper surface 111*a*, a lower surface 111*b* and a window 111*c* penetrating the upper surface 111*a* and the lower surface 111*b*, a circuit layer 112 having a first surface 112*a*, a second surface 112*b*, a plurality of internal contact pads 112*c* and a plurality of external contact pads 112*d*, and a first passivation layer 113. In this embodiment, the circuit layer 112 substantially comprises a first circuit layer 112' and a second circuit layer 112". The first circuit layer 112' is formed on the lower surface 111b and has the first surface 112a, a plurality of electrostatic conductive pads 112e close to the window 111c of the dielectric layer 111 and the internal contact pads 112c formed on the lower surface 111b of the dielectric layer 111. The second circuit layer 112" formed on the upper surface 111a of the dielectric layer 111 has the second surface 112b. In this embodiment, the external contact pads 112d are formed on the second circuit layer 112".

Referring again to FIGS. 2 and 3, the first passivation layer 113 formed on the first surface 112a of the first circuit layer 112" has a plurality of first openings 113a for exposing the internal contact pads 112c. It is preferable to further has a second passivation layer 114 formed on the second surface 112b of the second circuit layer 112" on which there is a plurality of second openings 114a for exposing the external contact pads 112d. The fingerprint sensor chip 120 has an active surface 121, a back surface 122, a sensing region 123 and a plurality of bumps 124 in which the sensing region 123 is formed on the active surface 121 and exposed by the window 111c of the dielectric layer 111, the bumps 124 are formed on the active surface 121, located at the exterior of the sensing region 123 and electrically connected with the internal contact pads 112c, for example, ACP (Antisotropic Conductive Paste) or NCP (Non-Conductive Paste) may be applied for electrically connecting the bumps 124 with the internal contact pads 112c. The sliding type thin fingerprint sensor package 100 further has an underfilling material 140 preferably formed between the substrate 110 and the fingerprint sensor chip 120 for encapsulating the bumps 124.

Figure 5:
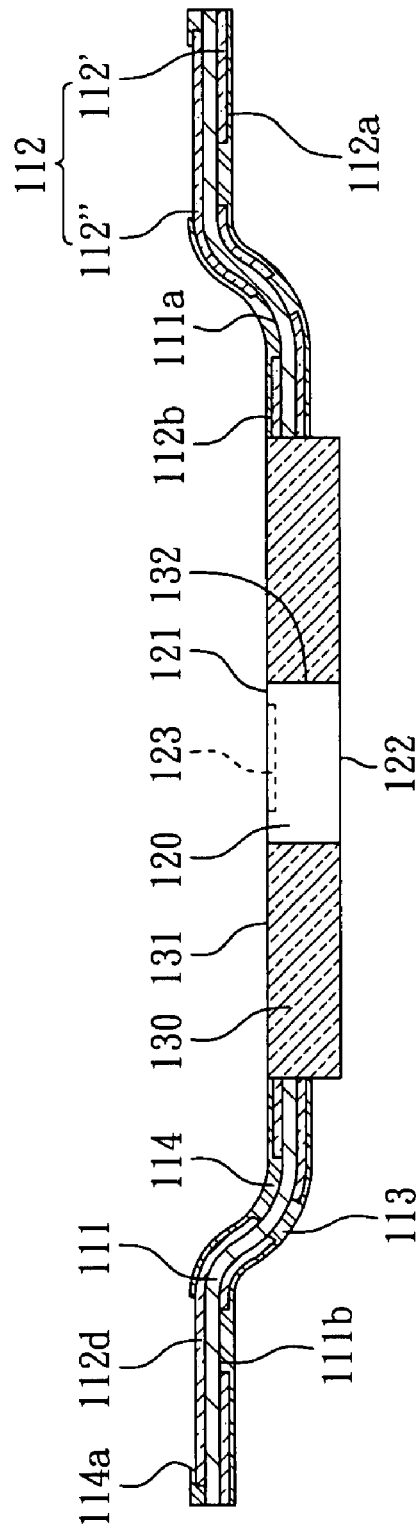
FIG. 5 is another cross-sectional view of the sliding type thin fingerprint sensor package taken along C-C direction in FIG. 2 in accordance with a first embodiment of the present invention.
Figure 6:
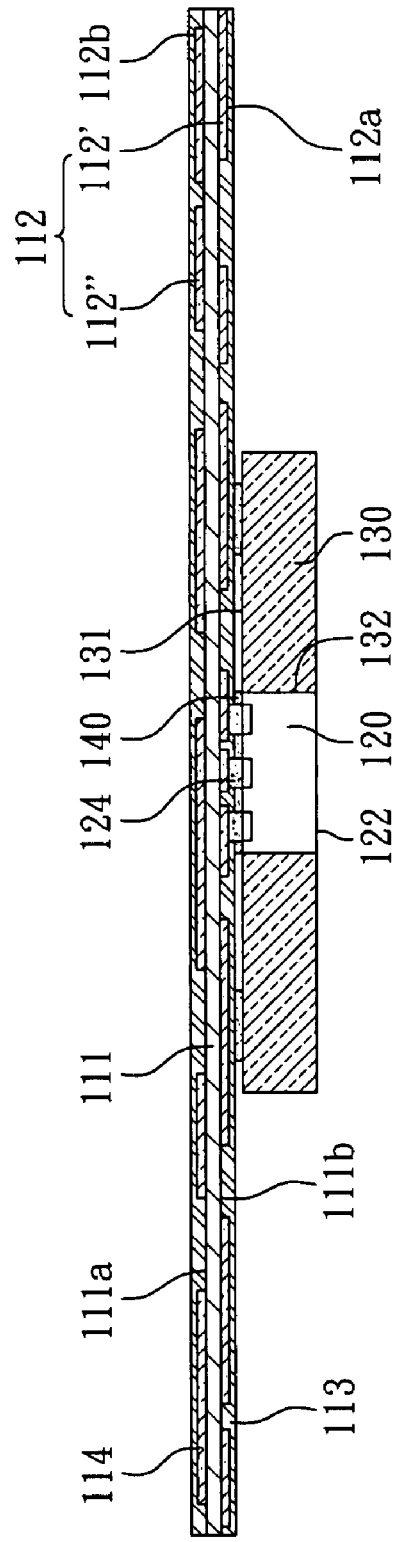
FIG. 6 is another cross-sectional view of the sliding type thin fingerprint sensor package taken along D-D direction in FIG. 2 in accordance with a first embodiment of the present invention.

Referring to FIGS. 2 and 4, the metal plate 130, which electrically connects with the electrostatic conductive pads 112e via soldering material, bump or ACP, has a sliding surface 131 close to the sensing region 123 of the fingerprint sensor chip 120 exposed by the window 111c of the dielectric layer 111. Wherein, the sensing region 123 of the fingerprint sensor chip 120 and the sliding surface 131 of the metal plate 130 are located at the sliding region 100a and exposed by the window 111c of the dielectric layer 111, the external contact pads 112d of the second circuit layer 112" are located at the conductive portion 100b. Referring to FIGS. 1, 2 and 3, in this embodiment, the metal plate 130 has a cavity 132 formed on the sliding surface 131 and the fingerprint sensor chip 120 is accommodated in the cavity 132. The active surface 121 of the fingerprint sensor chip 120 is preferably aligned with the sliding surface 131 of the metal plate 130, thereby making it advantageous for that an electrostatic is discharged via the sliding surface 131 of the metal plate 130 in the sliding region 100a when finger touches the sliding region 100a of the sliding type thin fingerprint sensor package 100 and the sensing region 123 of the fingerprint sensor chip 120. In this embodiment as referred in FIGS. 5 and 6, the cavity 132 penetrates the metal plate 130 and exposes the back surface 122 of the fingerprint sensor chip 120. Besides, referring again to FIG. 1, the window 111c of the dielectric layer 111 has two long sides 111d and there is an interval D between the two long sides, the metal plate 130 has a width W less than or equal to the interval D.

Figure 7:
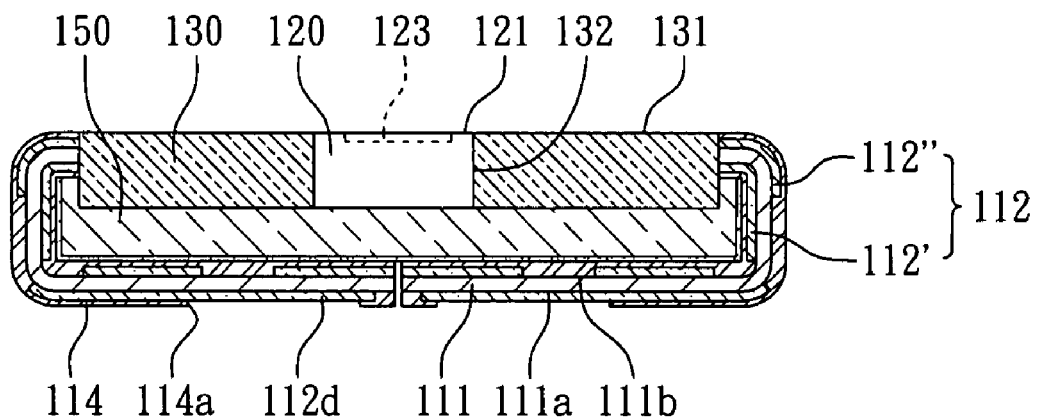
FIG. 7 is a cross-sectional view illustrating that the conductive portion of the sliding type thin fingerprint sensor package has two bent sides encapsulating the shell in accordance with a first embodiment of the present invention.
Figure 8:
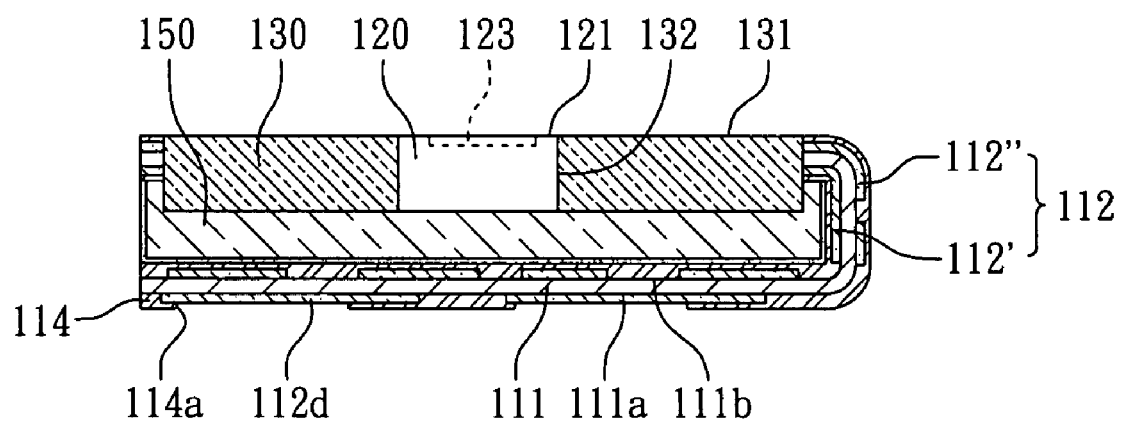
FIG. 8 is a cross-sectional view illustrating that the conductive portion of the sliding type thin fingerprint sensor package has one bent side encapsulating the shell in accordance with a first embodiment of the present invention.

Referring to FIG. 7, the sliding type thin fingerprint sensor package 100 further has a shell 150 capping the metal plate 130 at least, however, in this embodiment, the shell 150 caps the metal plate 130 as well as the back surface 122 of the fingerprint sensor chip 120. The shell 150 is made of either polymeric material (such as encapsulant) or metal material (such as metal cover), and the external contact pads 112d are located at two sides of the substrate 110. Moreover, the conductive portion 100b of the sliding type thin fingerprint sensor package 100 has two bent sides covering the shell 150 and at least one external contact pad 112d is located under the shell 150. In another situation, referring to FIG. 8, the external contact pads 112d are located at a same side of the substrate 110 and the conductive portion 100b has one bent side only covering the shell 150.

Figure 9:
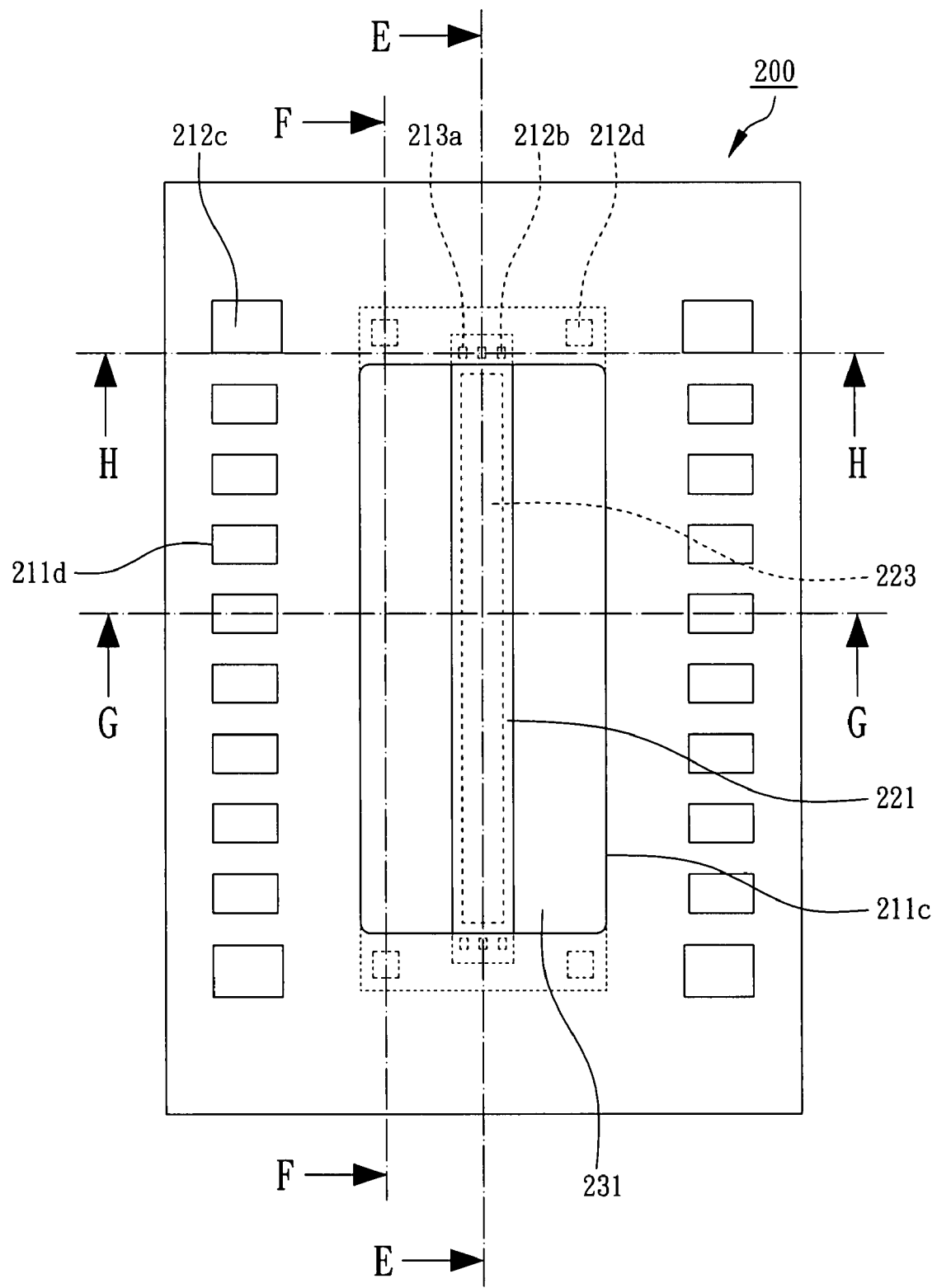
FIG. 9 is a top view of another sliding type thin fingerprint sensor package in accordance with a second embodiment of the present invention.
Figure 10:
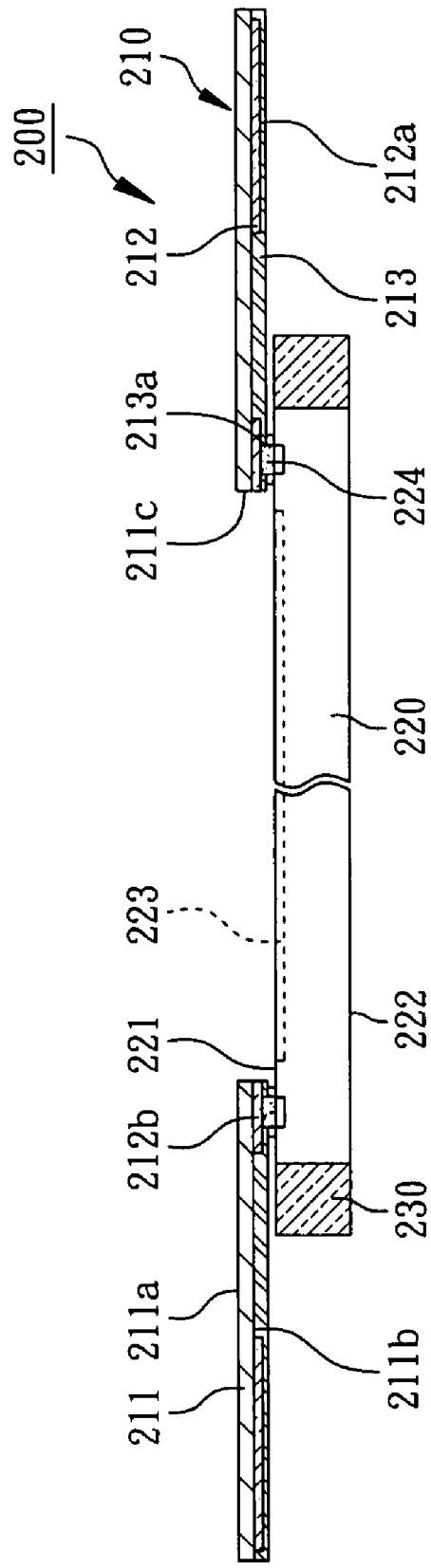
FIG. 10 is a cross-sectional view of the sliding type thin fingerprint sensor package taken along E-E direction in FIG. 9 in accordance with a second embodiment of the present invention.
Figure 11:
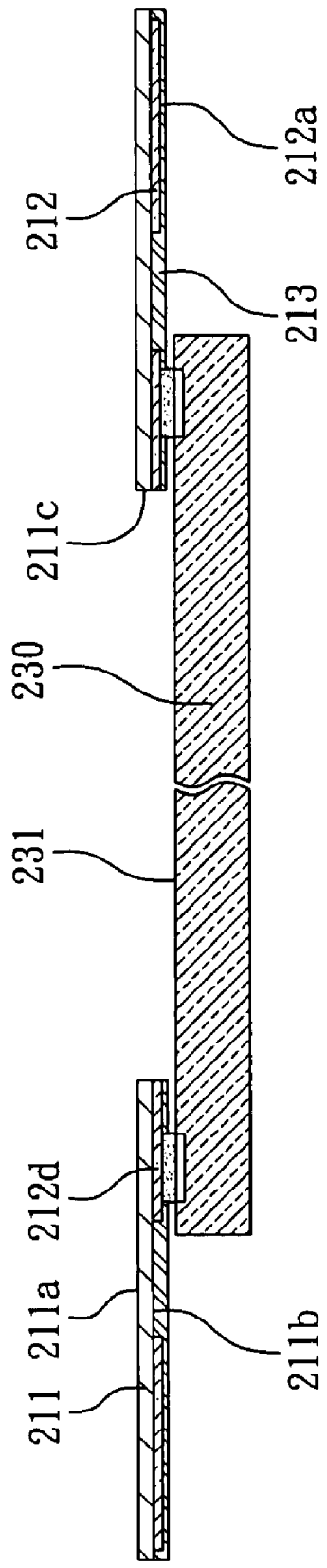
FIG. 11 is a cross-sectional view of the sliding type thin fingerprint sensor package taken along F-F direction in FIG. 9 in accordance with a second embodiment of the present invention.
Figure 12:
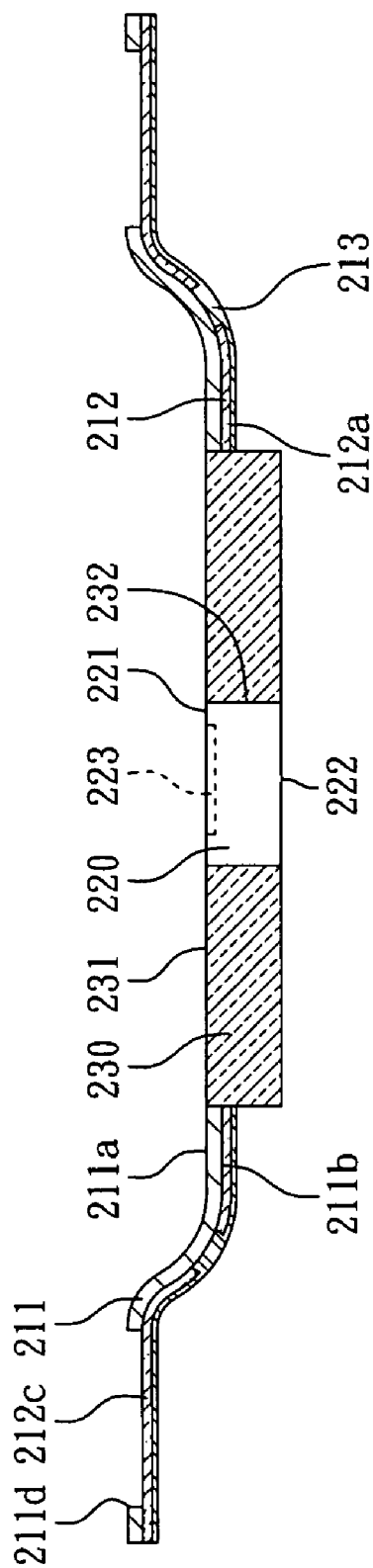
FIG. 12 is a cross-sectional view of the sliding type thin fingerprint sensor package taken along G-G direction in FIG. 9 in accordance with a second embodiment of the present invention.

Besides, FIG. 9 is a top view illustrating another sliding type thin fingerprint sensor package 200 disclosed in a second embodiment of the present invention, referring to FIGS. 9 and 10, which comprises a substrate 210, a fingerprint sensor chip 220 and a metal plate 230. In this embodiment, the substrate is a single-circuit layer and has a dielectric layer 211, a first circuit layer 212 and a first passivation layer 213. The dielectric layer 211 has an upper surface 211a, a lower surface 211b and a window 211c penetrating the upper surface 211a and the lower surface 211b. Referring to FIGS. 9, 10 and 11, the first circuit layer 212 has a first surface 212a, a plurality of internal contact pads 212b, a plurality of external contact pads 212c and a plurality of electrostatic conductive pads 212d, wherein the internal contact pads 212b are formed on the lower surface 211b of the dielectric layer 211, the electrostatic conductive pads 212d is close to the window 211c of the dielectric layer 211. The first passivation layer 213 is formed on the first surface 212a of the first circuit layer 212 and has a plurality of first openings 213a for exposing the internal contact pads 212b. Referring to FIG. 12, the dielectric layer further has a plurality of third openings 211d for exposing the external contact pads 212c.

Figure 13:
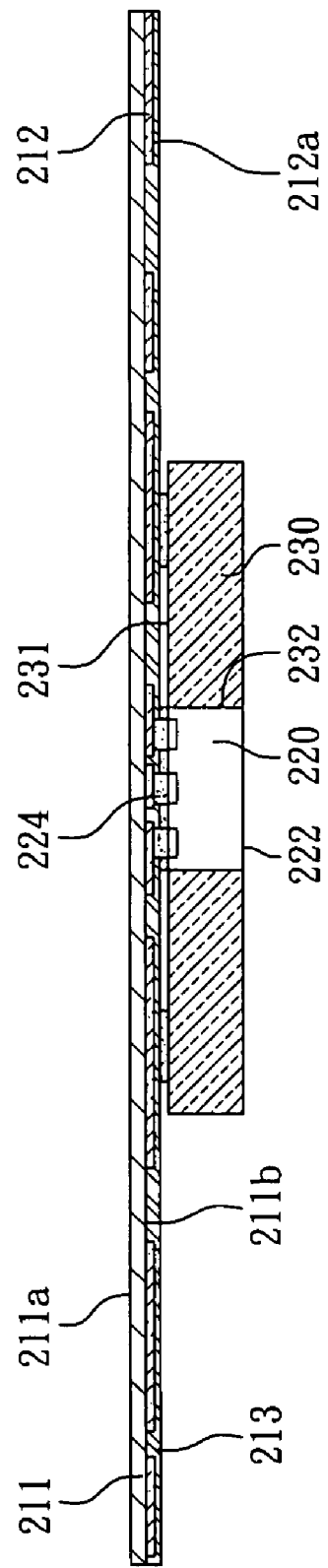
FIG. 13 is a cross-sectional view of the sliding type thin fingerprint sensor package taken along H-H direction in FIG. 9 in accordance with a second embodiment of the present invention.
Figure 14:
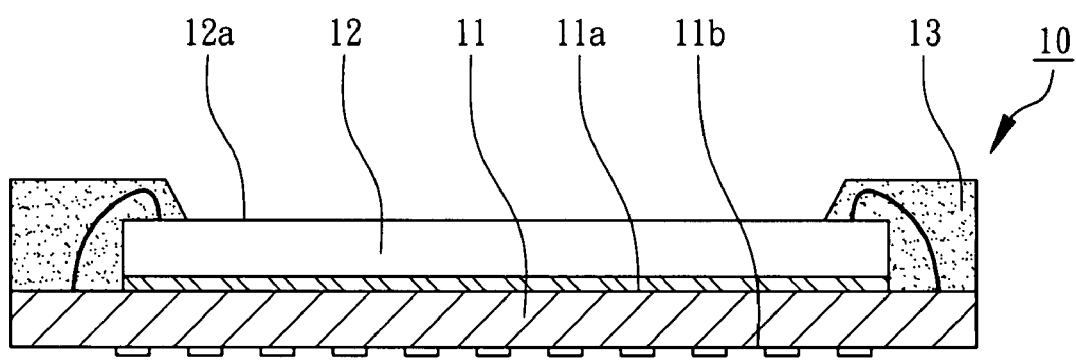
FIG. 14 is a cross-sectional view of a known fingerprint sensor package.

Referring again to FIG. 10, the fingerprint sensor chip 220 electrically connected with the internal contact pads 212b has an active surface 221, a back surface 222, a sensing region 223 and a plurality of bumps 224 in which the sensing region 223 is formed on the active surface 221 and exposed by the window 211c of the dielectric layer 211. Referring again to FIGS. 10 and 11, the metal plate 230 is electrically connected with the electrostatic conductive pads 212d of the substrate 210 via soldering material, bump or ACP and has a sliding surface 231 close to the sensing region 223 of the fingerprint sensor chip 220 and exposed by the window 211c of the dielectric layer 211. Referring to FIGS. 12 and 13, the metal plate 230 has a cavity 232 formed on the sliding surface 231 and the cavity 232 penetrates the metal plate 230. The cavity 232 accommodates the fingerprint sensor chip 220 and exposes the back surface 222 of the fingerprint sensor chip 220. The active surface 221 of the fingerprint sensor chip 220 is preferably aligned with the sliding surface 231 of the metal plate 230, thereby making it advantageous for that an electrostatic may be discharged via the sliding surface 231 of the metal plate 230 when finger touches the sensing region 223 of the fingerprint sensor chip 220.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:
1. A sliding type thin fingerprint sensor package defined as a sliding region and a conductive portion comprising:
   a substrate comprising:
      a dielectric layer having an upper surface, a lower surface and a window penetrating the upper surface and the lower surface;

a circuit layer having a first surface, a second surface, a plurality of internal contact pads formed on the lower surface of the dielectric layer, and a plurality of external contact pads; and a first passivation layer formed on the first surface of the circuit layer and having a plurality of first openings for exposing the internal contact pads;

a fingerprint sensor chip electrically connected with the internal contact pads and having an active surface, a back surface, and a sensing region formed on the active surface and exposed by the window of the dielectric layer; and a metal plate electrically connected with the substrate and having a sliding surface close to the sensing region of the fingerprint sensor chip and exposed by the window of the dielectric layer;

wherein, the sensing region of the fingerprint sensor chip and the sliding surface of the metal plate are located at the sliding region, the external contact pads of the circuit layer are located at the conductive portion.

2. The sliding type thin fingerprint sensor package in accordance with claim 1, wherein the circuit layer comprises a first circuit layer formed on the lower surface of the dielectric layer and a second circuit layer formed on the upper surface of the dielectric layer, the second circuit layer has the second surface, the first circuit layer has the first surface, at least one electrostatic conductive pad and the internal contact pads, the metal plate is electrically connected with the electrostatic conductive pad.

3. The sliding type thin fingerprint sensor package in accordance with claim 2, wherein the external contact pads are formed on the second circuit layer.

4. The sliding type thin fingerprint sensor package in accordance with claim 3, wherein the substrate further has a second passivation layer formed on the second surface of the second circuit layer and having a plurality of second openings for exposing the external contact pads.

5. The sliding type thin fingerprint sensor package in accordance with claim 2, wherein the external contact pads are formed on the first circuit layer.

6. The sliding type thin fingerprint sensor package in accordance with claim 5, wherein the dielectric layer has a plurality of third openings for exposing the external contact pads.

7. The sliding type thin fingerprint sensor package in accordance with claim 2, wherein the electrostatic conductive pad is close to the window of the dielectric layer.

8. The sliding type thin fingerprint sensor package in accordance with claim 1, wherein the fingerprint sensor chip has at least one bump formed on the active surface and located at the exterior of the sensing region, the bump is electrically connected with the internal contact pads.

9. The sliding type thin fingerprint sensor package in accordance with claim 8, further comprising an underfilling material, which is formed between the substrate and the fingerprint sensor chip and encapsulates the bump.

10. The sliding type thin fingerprint sensor package in accordance with claim 1, wherein the metal plate has a cavity formed on the sliding surface to accommodate the fingerprint sensor chip.

11. The sliding type thin fingerprint sensor package in accordance with claim 10, wherein the cavity penetrates the metal plate and exposes the back surface of the fingerprint sensor chip.

12. The sliding type thin fingerprint sensor package in accordance with claim 1, wherein the active surface of the fingerprint sensor chip is aligned with the sliding surface of the metal plate.

13. The sliding type thin fingerprint sensor package in accordance with claim 1, wherein the window of the dielectric layer has two long sides, there is an interval between the two long sides, and the metal plate has a width less than or equal to the interval.

14. The sliding type thin fingerprint sensor package in accordance with claim 1, further comprising a shell, which caps the metal plate at least.

15. The sliding type thin fingerprint sensor package in accordance with claim 14, wherein the shell caps the back surface of the fingerprint sensor chip.

16. The sliding type thin fingerprint sensor package in accordance with claim 14, wherein the shell is made of polymeric material or metal material.

17. The sliding type thin fingerprint sensor package in accordance with claim 14, wherein the conductive portion is bent to cover the shell and at least one external contact pad is located under the shell.

18. The sliding type thin fingerprint sensor package in accordance with claim 1, wherein the substrate may use a flexible substrate.

* * * * *